United States Patent
Immink et al.

(10) Patent No.: US 7,519,119 B2
(45) Date of Patent: Apr. 14, 2009

(54) METHOD AND APPARATUS OF CONVERTING A SERIES OF DATA WORDS INTO A MODULATED SIGNAL

(75) Inventors: Kees A. Schouhamer Immink, Geldrop (NL); Seong Keun Ahn, Seoul (KR); Sang Woon Seo, Seoul (KR); Jin Yong Kim, Kyunggi-do (KR)

(73) Assignee: LG Electronics Inc., Seoul (KR)

( * ) Notice: Subject to any disclaimer, the term of this patent is extended or adjusted under 35 U.S.C. 154(b) by 472 days.

(21) Appl. No.: 10/971,025

(22) Filed: Oct. 25, 2004

(65) Prior Publication Data

US 2005/0053160 A1 Mar. 10, 2005

Related U.S. Application Data

(63) Continuation of application No. 09/853,758, filed on May 14, 2001, now Pat. No. 6,829,306.

(30) Foreign Application Priority Data

Jun. 22, 2000 (EP) .................................. 00202173
Apr. 7, 2001 (KR) ............................... 2001-18531

(51) Int. Cl.
*H04B 14/04* (2006.01)
(52) U.S. Cl. ........................ 375/253; 375/240; 341/59; 358/426.13; 382/245
(58) Field of Classification Search ................ 375/240, 375/376; 711/4, 160; 360/51
See application file for complete search history.

(56) References Cited

U.S. PATENT DOCUMENTS 6,002,718 A * 12/1999 Roth ........................... 375/240

(Continued)

FOREIGN PATENT DOCUMENTS

EP 0 415 853 A2 3/1991

(Continued)

OTHER PUBLICATIONS

Kees A. Schouhamer Immink, "EFMPlus: The Coding Format of the Multimedia Compact Disc", IEEE Transactions on Consumer Electronics, IEEE Service Center, New York, NY, US, vol. 41, No. 3, Aug. 1, 1995, pp. 491-497.

(Continued)

*Primary Examiner*—David C Payne
*Assistant Examiner*—Adolf Dsouza
(74) *Attorney, Agent, or Firm*—Birch, Stewart, Kolasch & Birch, LLP (57) ABSTRACT

The present invention relates to method and apparatus of converting a series of data words into modulated signals. This method divides a data word, which a sync signal is to be added in front or rear of when it is written in a recording medium, into two or more word segments, generates for each word segment a number of intermediate sequences by combining mutually different digital words with that word segment, scrambles these intermediate sequences to form alternative sequences, translates each alternative sequence into a (d,k) constrained sequence, checks how many undesired sub-sequences are contained in each (d,k) constrained sequence, and selects one (d,k) constrained sequence for recording on an optical or magneto-optical recording medium among the (d,k) constrained sequences not having the undesired subsequence. Applying this method to a modulating device, DSV control can be conducted by much simpler hardware.

18 Claims, 6 Drawing Sheets

U.S. PATENT DOCUMENTS 6,188,335 B1 * 2/2001 Roth et al. .................. 341/59
6,606,038 B2    8/2003 Immink et al.

FOREIGN PATENT DOCUMENTS

| EP | 0 991 195 A2 | 4/2000 |
|---|---|---|
| KR | 1020000035065 A | 6/2000 |
| KR | 1020000049103 A | 7/2000 |

OTHER PUBLICATIONS

Siegal, et al., "Modulation and Coding for Information Storage", IEEE Communications Magazine, IEEE Service Center, New York, NY, US, vol. 29, No. 12, Dec. 1, 1991, pp. 68-86.

Wilson et al., "A Comparison of Two Coding Schemes for Generating DC-Free Runlength-Limited Sequences", Jpn. J. Appl. Phys. vol. 39, 2000, pp. 815-818, Part 1, No. 2B, Feb. 2000.

* cited by examiner

METHOD AND APPARATUS OF CONVERTING A SERIES OF DATA WORDS INTO A MODULATED SIGNAL

This application is a Continuation of application Ser. No. 09/853,758 (now allowed) filed on May 14, 2001, now U.S. Pat. No. 6,829,306 which claims priority based on European Application No. 00202173.1 filed Jun. 22, 2000 and Korean Application No. 01-18531 filed Apr. 7, 2001. The entire contents of each of these applications are hereby incorporated by reference.

BACKGROUND OF THE INVENTION

1. Field of the Invention

The present invention relates to method and apparatus of modulating a series of data words into (d,k) constrained sequence with good suppression of a direct current (DC) component.

2. Description of the Related Art

Run length limited codes, generically designated as (d,k) codes, have been widely and successfully applied in modern magnetic and optical recording systems. Such codes, and means for implementing said codes, are described by K. A. Schouhamer Immink in the book entitled "Codes for Mass Data Storage Systems" (ISBN 90-74249-23-X, 1999).

Run length limited codes are extensions of earlier non return to zero recording (NRZ) codes, where binarily recorded "zeros" are represented by no (magnetic flux) change in the recording medium, while binary "ones" are represented by transitions from one direction of recorded flux to the opposite direction.

In a (d,k) code, the above recording rules are maintained with the additional constraints that at least d "zeros" are recorded between successive data "ones", and no more than k "zeros" are recorded between successive data "ones". The first constraint arises to obviate intersymbol interference occurring due to pulse crowding of the reproduced transitions when a series of "ones" are contiguously recorded. The second constraint arises in recovering a clock from the reproduced data by "locking" a phase locked loop to the reproduced transitions. If there is too long an unbroken string of contiguous "zeros" with no interspersed "ones", the clock regenerating phase-locked-loop will fall out of synchronism.

In, for example, a (1,7) code there is at least one 'zero' between recorded "ones", and there are no more than seven recorded contiguous "zeros" between recorded "ones". The series of encoded bits is converted, via a modulo-2 integration operation, to a corresponding modulated signal formed by bit cells having a high or low signal value, a 'one' bit being represented in the modulated signal by a change from a high to a low signal value or vice versa. A 'zero' bit is represented by the lack of change of the modulated signal.

The minimum inversion period Tmin, which can be expressed by (d+1)T is thus equal to 2T where T is a bit time interval in the recording wave train. The maximum inversion period Tmax, which can be expressed by (k+1)T, is thus equal to 8T.

By the way, in a train of channel bits generated by a (1,7) code the minimum inversion period Tmin is more frequently observed than inversion periods of length 3T, 4T, etc. The fact that a lot of edge information is generated at short intervals such as 2T and 3T is advantageous to the generation of a clock signal in many cases.

As the recording density is increased, however, the minimum inversion period Tmin this time becomes a problem. That is if minimum runs 2T are generated consecutively the recording wave train is prone to distortion generated therein. This is because a 2T wave output amplitude is smaller than other wave output amplitudes and, hence, easily affected by factors such as a defocus and a tangential tilt.

In addition, at a high line density, recording of consecutive minimum marks (2T) is also easily affected by disturbances such as noise. Thus, an operation to play back the data will also be prone to errors. In this case, a pattern of errors in reproduction of the data is observed as shifts of the front and rear edges of a minimum mark in many cases. As a result, the length of the generated bit error increases.

As described above, when data is transmitted through a transmission line or recorded onto a medium, the data is modulated into a coded sequence matching the transmission line or recording medium prior to the transmission or recording. If the coded sequence resulting from the modulation contains a direct current (DC) component, a variety of error signals such as tracking errors generated in control of a servo of the disk drive become prone to variations or jitter are generated easily.

The first reason for using said dc-free signals is that recording channels are not normally responsive to low-frequency components. The suppression of low-frequency components in the signal is also highly advantageous when the signal is read from an optical record carrier on which the signal is recorded in the track, because then continuous tracking control undisturbed by the recorded signal is possible.

A good suppression of the low-frequency components leads to improved tracking with less disturbing audible noise. For this reason it is thus desirable to make as many efforts to prevent the modulated sequence from containing a direct current component as possible.

In order to prevent the modulated sequence from containing a direct current component, control of a DSV (Digital Sum Value) to prevent the modulated signal from containing a direct current component has been proposed. The DSV is a total found by adding up the values of a train of bits, wherein the values +1 and −1 are assigned to '1' and '0' in the train respectively, which results after NRZI modulation of a train of channel bits. The DSV is an indicator of a direct current component contained in a train of sequences.

A substantially constant running digital sum value (DSV) means that the frequency spectrum of the signal does not comprise frequency components in the low frequency area. Note that DSV control is normally not applied to a sequence generated by a standard (d,k) code. DSV control for such standard (d,k) codes is accomplished by calculating a DSV of a train of encoded bits after the modulation for a predetermined period of time and inserting a predetermined number of DSV control bits into the train of encoded bits. In order to improve the code efficiency it is desirable to reduce the number of DSV control bits to a smallest possible value.

Preferably, the encoded signal comprises a sequence of q code words, where q is an integer. Between encoded signal portions are inserted synchronization (sync) signals. Preferably, the sync signal should not occur in a sequence of the encoded signal. Conventionally, the sync pattern contains a series of s consecutive bits equal to the logical "0", where s is an integer exceeding k, or alternatively the sync pattern consists of two series of k bits having a logical "0" separated by a bit having a logical "1", i.e. two consecutive runs of k "0"s.

A disadvantage of the usage of such sync patterns is that they are relatively long, and therefore reduce the efficiency of the recording. Therefore, preferably, a short sync pattern is used, which may comprise a sequence of two or more consecutive "0" runs.

An example of the use of such signals to record and read an audio signal on an optical or magneto-optical record carrier can be found in U.S. Pat. No. 4,501,000. The specification describes the Eight-to-Fourteen (EFM) modulation system, which is used for recording information on Compact Disks (CD) or MiniDisk (MD). The EFM-modulated signal is obtained by converting a series of 8-bit information words into a series of 14-bit code words, and where 3-bit merging words are inserted between consecutive code words.

Respective code words of 14 bits satisfy the conditions that at least d=2 and at most k=10 "0"s are placed between two "1"s. In order to satisfy this condition also between code words, 3-bit merging words are used. Four 3-bit merging words of 8 possible 3-bit merging words are permitted to be used, namely "001", "010", "000", and "100". The remaining possible 3-bit merging words, namely "111", "011", "101", and "110" are not used as they violate the prescribed d=2 constraint.

One of the four allowed merging words is selected such that the bit string obtained after cascading alternate code words and merging words satisfies the (d,k)-constraint, and that in the corresponding modulo-2 integrated signal the DSV remains substantially constant. By deciding the merging words according to above rules, low-frequency components of the modulated signal can be reduced.

The choice for the 3-bit merging words is based on the requirement that, on the one hand the channel signal is satisfied. Decoding of EFM signals is very simple. A sync pattern is multiplexed between 33 alternative 3-bit merging words and 14-bit code words. The 27-bit sync pattern used in the CD format consists of two consecutive runs of then "0"s plus 3-bit merging word.

The choice of the merging words avoids the occurrence of said sync pattern in the output sequence. The relative occurrence of the sync pattern in this format is, 27 bits in a total of 588 bits, 4.6%. The decoded skips the 3-bit merging words, and the 14-bit code words are translated, using a look-up table or PLA etc., into the information bytes (8 bits).

Information recording has a constant need for increasing the reading and writing speed. The aim of increased reading speed, however, requires higher servo bandwidth of the tracking mechanism, which, in turn, sets more severe restrictions on the suppression of the low-frequency components in the recorded signal.

Improved suppression of the low-frequency components is also advantageous for suppressing audible noise arising from the tracking mechanism. For this reason, it is desirable to make as many efforts to prevent the signal from containing low-frequency components.

SUMMARY OF THE INVENTION

It is an object of the present invention to provide a coding system being able to generate for each data word a corresponding sequence, which can suppress dc-components, and does not contain a sync pattern, long string of '0's, and long runs of the smallest runlength d, under the rules of the (d,k) code for recording onto a recordable medium.

It is another object of the present invention to provide method and apparatus of converting a series of data words into a modulated signal, which can conduct DSV control through much simpler hardware.

A method of converting a series of data words into a modulated signal with a predefined coding rate of m/n according to the present invention, generates for each data word a number of intermediate sequences by combining mutually different digital words with the data word wherein a length r of the digital word has been determined such that bit length of the data word added by the length r is a multiple of m, scrambles each intermediate sequence to form a set of alternative sequences, translates each alternative sequence into a (d,k) constrained sequence according to the coding rate m/n, measures how much undesirable each (d,k) constrained sequence is, and selects one (d,k) constrained sequence for recording onto a recordable medium among the translated (d,k) constrained sequences based on the measured results.

Another method of converting a series of data words into a modulated signal according to the present invention, divides an input data word into two or more data segments wherein the input data word having data size a sync signal is to be combined in front or in rear of before being written in a recordable medium, generates for each divided data segment a number of intermediate sequences by combining mutually different digital words with the data segment, scrambles each intermediate sequence to form a set of alternative sequences, translates each alternative sequence into a (d,k) constrained sequence according to a predefined coding rate m/n, measures how much undesirable each (d,k) constrained sequence is, and selects one (d,k) constrained sequence for recording onto the recordable medium among the translated (d,k) constrained sequences based on the measured results.

BRIEF DESCRIPTION OF THE DRAWINGS

The accompanying drawings, which are included to provide a further understanding of the invention, illustrate the preferred embodiments of the invention, and together with the description, serve to explain the principles of the present invention.

In the drawings.

DETAILED DESCRIPTION OF THE PREFFERRED EMBODIMENT

In order that the invention may be fully understood, a preferred embodiment thereof will now be described with reference to the accompanying drawings.

Figure 1:
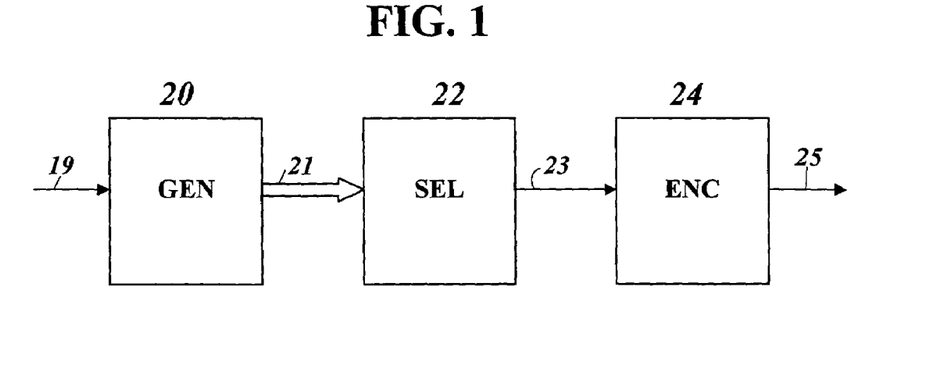
FIG. 1 shows a block diagram of an embodiment a coding system according to the present invention.

FIG. 1 shows a block diagram of an embodiment of an encoding system according to the invention.

Using a generator 20, a selector 22, the encoding system translates user data 19 into a (d,k) constrained sequence 23, wherein a plurality of predefined subsequence are fully absent or occur with small probability. The (d,k) constrained sequence, in turn, is translated, using a precoder 24, into a runlength-limited sequence 25 with suppressed low-frequency components.

Figure 2:
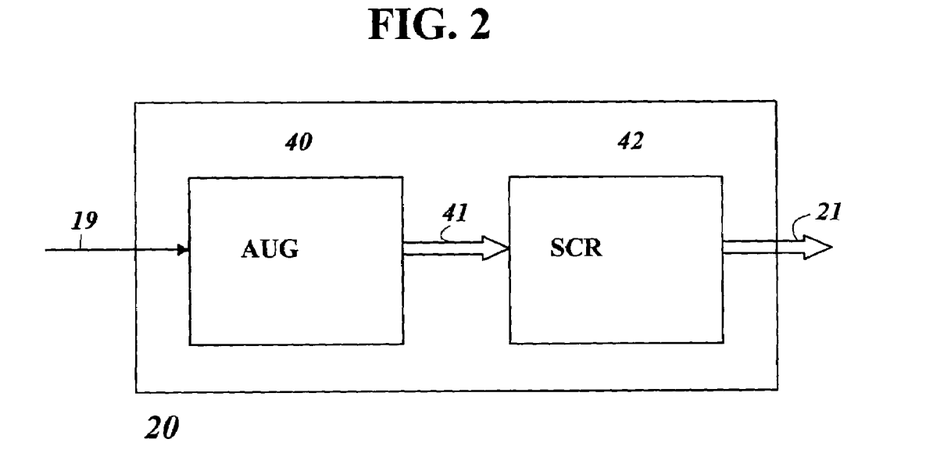
FIG. 2 shows an explanatory diagram of part of an embodiment of a coding scheme used for carrying out augmenting and scrambling of the digital words.

As shown in FIG. 1 the coding system comprises a generator 20, whose detailed block diagram is displayed in FIG. 2. The generator 20 comprises an augmentor 40 that generates for each word a number of intermediate sequences 41 by combining mutually different digital words with the data word 19. The intermediate sequences 41 can be generated augmentor 40 simply by placing the digital words in front, middle, or rear of the data word 19

The generator 20 further comprises a scrambler 42 that scrambles the intermediate sequences 41, one after each other, in order to form a selection set of alternative sequences 21. The inclusion of the mutually different digital words in the intermediate sequences 41 has the effect that the scrambler 42, which is preferably a self-synchronized scrambler, is initialized for each intermediate sequence 41 with a different digital word. Hence the alternative sequences 21 are relatively good randomizations of the data word 19.

Preferably the augmentor is embodied so as to generate for each data word 19 $2^r$ intermediate sequences 41 by combining all possible digital words of length r with the data word 19. In this way a selection set of alternative sequences 21 is obtained which is optimally randomized.

Figure 3:
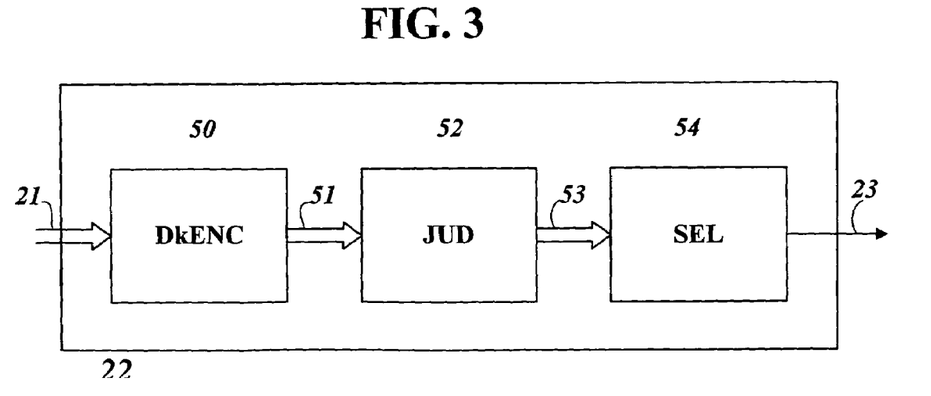
FIG. 3 shows a block diagram of a selector for use in a coding system according to the present invention.

FIG. 3 shows a detailed block diagram of the selector 22. The selector 22 comprises a (d,k) encoder 50, which translates each alternative sequence 21 into a (d,k) constrained sequence 51. To that end, the alternative sequence 21 is partitioned into q m-bit words, where q is an integer. Under the rules of (d,k) encoder 50, the q m-bit words are translated into q n-bit words, wherein n>m. The (d,k) encoder 50 can be of a standard type with parameter m=2, n=3, d=1, k=7 or alternatively m=1, n=2, d=2, k=7.

Preferably in order to achieve a high coding efficiency the encoder 50 has parameters m=9, n=13, d=1, or m=11, n=16, d=1, or m=13, n=19, d=1. Reference is made in this respect to the not published PCT application No. PCT/KR00/01292 (corresponding U.S. application Ser. No. 09/707,947). The encoder 50 may also has parameters m=6, n=11, d=2 or m=11, n=20, d=2, or m=7, n=13, d=2. Reference is made in this respect to the not published PCT application No. PCT/KR01/00359.

The selector 22 further comprises means 52 that determine for each alternative (d,k) constrained sequence 51 if the sequence 51 contains an undesired subsequence such as the sync pattern, a long string of "0"s, or a long string of alternative Tmin runs. If such an undesired subsequence is observed, then a judgment circuit will compute the penalty to be associated with that undesired subsequence.

The selector 22 further comprises means 52 that judges each alternative (d,k) constrained sequence 51 on the number of occurrences of undesired subsequence such as the sync pattern, or a long string of "0"s, or long string of alternative Tmin runs, and the contribution of the alternative sequence 21 to the low-frequency components.

Under the rules of the penalty algorithm, the judging means 52 gives a lower penalty for desired and a high penalty for undesired sequences. The selector 22 also comprises means 54 that selects the alternative (d,k) constrained sequence 51 with the lowest penalty.

Figure 4:
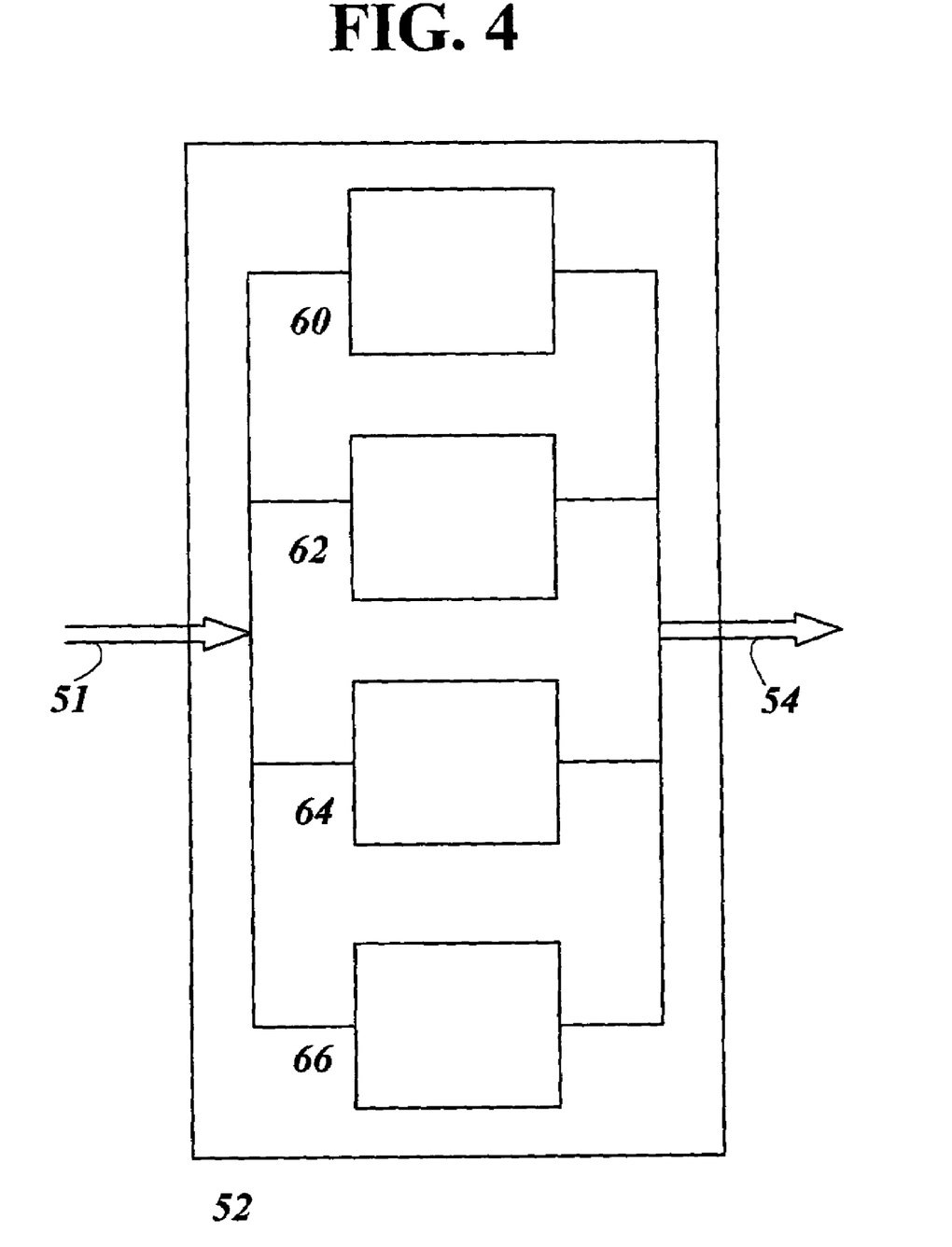
FIG. 4 is a diagram that illustrates the general method for judging the alternative sequences.

FIG. 4 is a diagram that illustrates the general method used in accordance with the present invention to judge and select the alternative (d,k) constrained sequence 51 with the lowest penalty. As depicted in FIG. 4 the judging means 52 comprises a number of metric calculators, which measure in parallel the "0" runlength 60, the occurrence of a prescribed sync pattern 62, the alternate Tmin runlength 64, and the low-frequency content 66, respectively.

The "0" runlength metric is used as a measure of consecutive "0"s (commonly referred to as a "0" runlength) detected within an alternative (d,k) constrained sequence 51. As discussed briefly above, when a "0" run persists within the sequence for an extended period, the recorded features such as pits and lands can become prohibitively long, which can be deleterious so that mistracking and errors are more likely to occur. Therefore, the longer a "0" runlength is, the higher the penalty to be given is.

The metric calculator 64 measures the number of consecutive Tmin (if d=1, Tmin is "01", if d=2, Tmin is "001") runlength in order to exclude a sequence having much repetitive 'Tmin's violating MTR (Maximum Transition Run) constraint, for example, a sequence of "01010101. . ." or "001001001001. . .". The metric calculator 64 flags such sequences which will be excluded from selectable alternative sequences by selection means 54.

The sync detector 62 detects if prescribed sync pattern occur in an alternative (d,k) constrained sequence 51. If, indeed, such a sync pattern is detected, the sync detector 62 flags that (d,k) constrained sequence, otherwise the sequence remains unflaged.

The metric calculator 66 measures the DSV of the alternative (d,k) constrained sequence 51 after this sequence had been modulated using a preceding device. Preferably the variance of the DSV is measured, as it is often a more adequate measure when sequence are relatively long, exceeding 100 bits.

The various metrics and the sync detector and k-condition flags are inputs of selection means 54. The selection means 54 finally takes a decision based on weights associated with the various input metrics of which of the alternative sequences will be selected and recorded. In this decision, alternative (d,k) constrained sequences whose flag is set by the judging means 52 are excluded.

In the preferred embodiment of the present invention, a sync pattern is used, which consists of at least two "0" runs, which are shorter than k. As a result, coding efficiency will benefit from such a relatively short sync pattern.

The alternative (d,k) constrained sequence 51 that has been selected by selector 54 is converted into a modulated signal using the NRZI pre-coding procedure. Then, the modulated signal is generated by the selected (d,k) constrained sequence 51 integrated modulo-2 in which a '1' becomes a transition and a '0' becomes an absence of a transition and forwarded to the recording medium.

In the meantime, the length r of the digital word is determined such that bit length A of the data word 19 added by r is multiple of m, that is, A+r=cm where c is an arbitrary integer.

For example, in coding rate m/n=9/13, if A is 728, r satisfying the multiple condition is 1, 10, 19, . . . , so that one is selected among these values for r. Considering the conventional ECC block scheme of DVD in which one sync frame has 91-byte user data, the condition of A=728 is used.

If 1 is selected for r, the number of digital words combined with an input data word 19 is two ($=2^1$), which generates only two intermediate sequences 41. However, it is unlikely that the selection means 54 can obtain a desired alternative (d,k) constrained sequence 51 among the two. Therefore, r=10 is preferable since 1024 ($=2^{10}$) intermediate sequences 41 can provide at least one desired (d,k) constrained sequence after good randomization.

When r is determined to 10, the capacity of 1024 ($=2^{10}$) parallel processing is needed, which inevitably accompanies complicated hardware.

Figure 5:
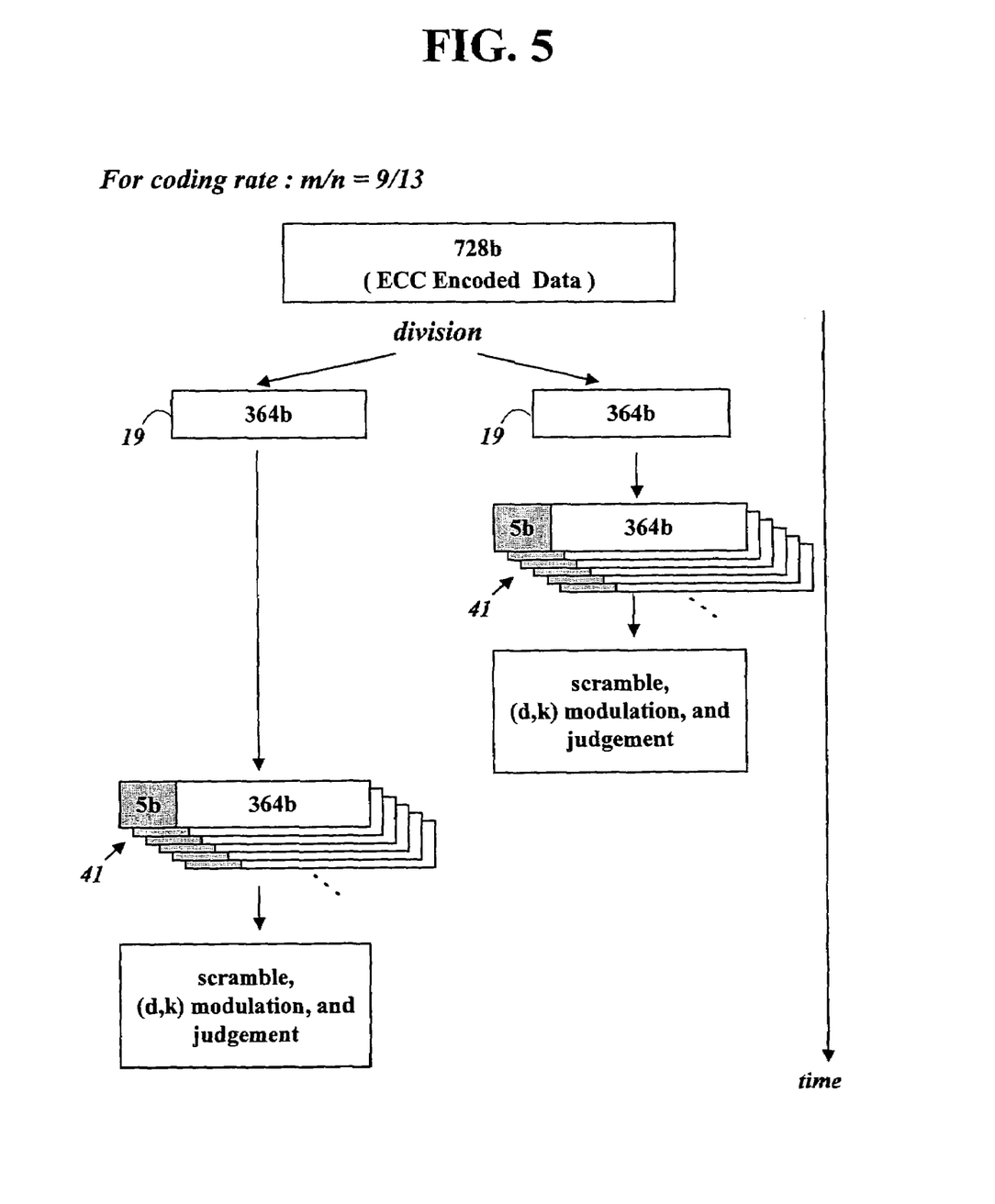
FIG. 5 depicts an embodiment of dividing a data word into two segments which are inputted to a generator sequentially according to the present invention.

FIG. 5 shows another method to determine the length r satisfying the condition of A+r=cm (c is an arbitrary integer). This method is able to reduce the complexity of necessary hardware.

In the method depicted schematically in FIG. 5, a 728-bit (A) input data word is divided into two 364-bit ($A_i$) data segments 19 which are applied to the augmentor 40 sequentially. 728-bit is the size that a sync signal is inserted in front or in rear of just before being written in a disk. In this case, $r_i$ satisfying the multiple condition of $A_i+r_i=c_i m$ ($c_i$ is an arbitrary integer) is 5, 14, . . . since m is 9. For this division, a means for dividing the 728-bit input data word is placed in front of the augmentor 40. The augmentor 40 generates for each divided 364-bit word 32 intermediate sequences 41 by combining mutually different 32 ($=2^5$) digital words with the data word 19 since 364($A_i$)+5($r_i$) is a multiple of 9(m). The 32 intermediate sequences 41 are outputted in parallel from each register of the augmentor 40.

If coding rate m/n=6/11 with A=728, r satisfying the multiple condition is 4, 10, 16, . . . . Among these bit lengths of r, 4 is preferable because 16 (=24) intermediate sequences 41 probably achieves reasonable randomization and requires proper number of registers.

Another method to select the length r for the case of m/n=6/11 is to divide a 728-bit (A) input data word into eight 91-bit ($A_i$) data words which are in turn applied to the augmentor 40. In this division embodiment, the best $r_i$ is 5 because 91($A_i$)+5($r_i$) is a multiple of 6(m). Therefore, 32 (=25) digital words and intermediate sequences 41 are generated, respectively.

Figure 6:
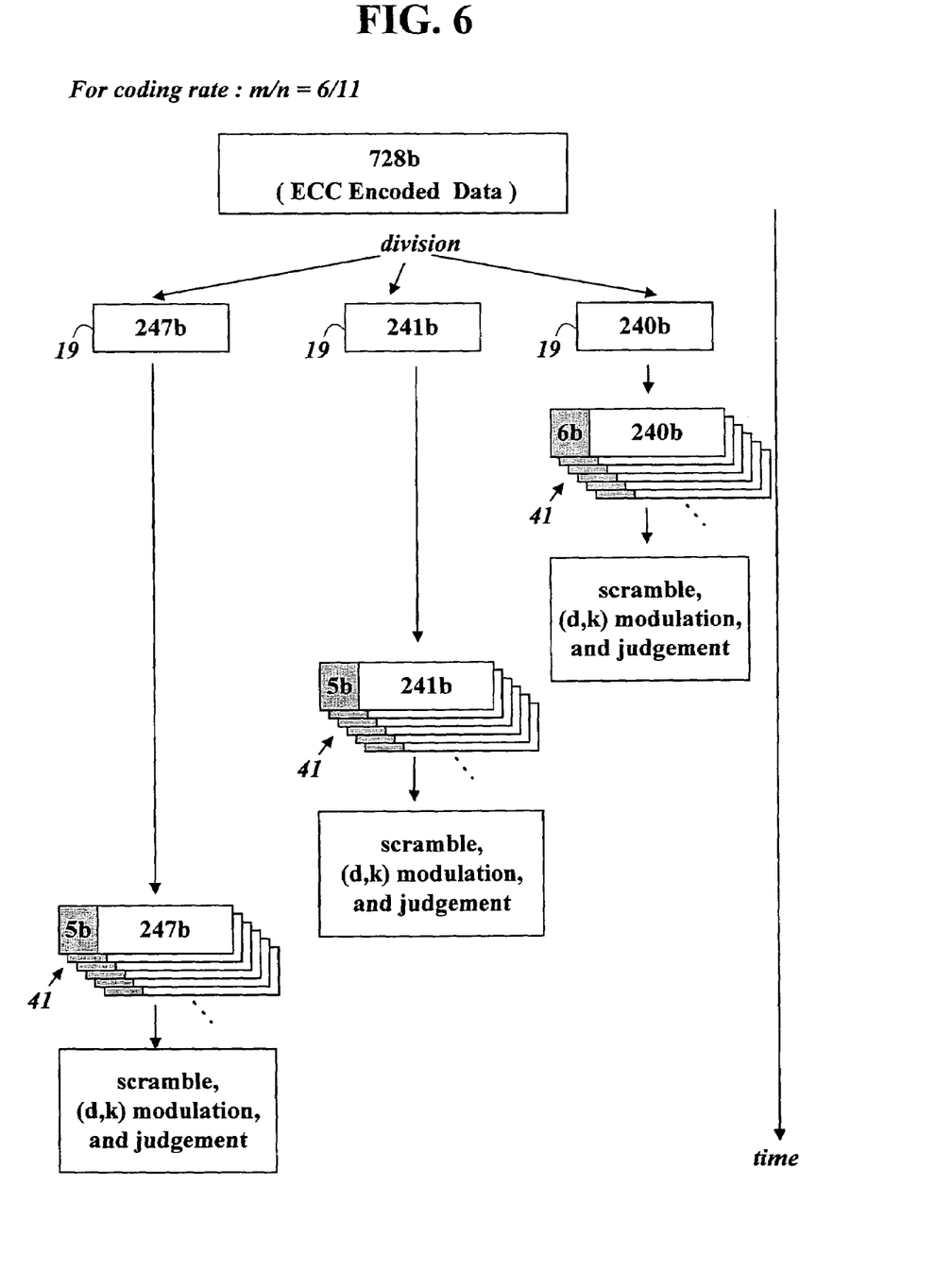
FIG. 6 depicts another embodiment of dividing a data word into three segments which are inputted to a generator sequentially according to the present invention.

A 728-bit input data word may be divided such that at least two of the divided segments are not same in size. FIG. 6 shows one of such embodiments.

In the embodiment depicted schematically in FIG. 6, a 728-bit input data word is divided into three data words 19 whose sizes are 247, 241, and 240, respectively. Because of the different size, the length r for each divided data word is not same. For the 247-bit and 241-bit data word, 5-bit digital word is used. For the 240-bit data word, 6-bit digital word is used. Therefore, 32 ($=2^5$) intermediate sequences 41 are generated for data words of the former size whereas 64 ($=2^6$) intermediate sequences 41 are generated for the latter size.

For each case, the size of a divided data word combined with corresponding digital word becomes 252(42m), 246(41m), or 246(41m) which is a multiple of m(=6).

In the above embodiments, it is preferable that the bit length r is determined in proportion to length of a data word 19. Thus, if length of a data word 19 is smaller than the above example, r may be chosen from bit lengths below 5.

Figure 7A:
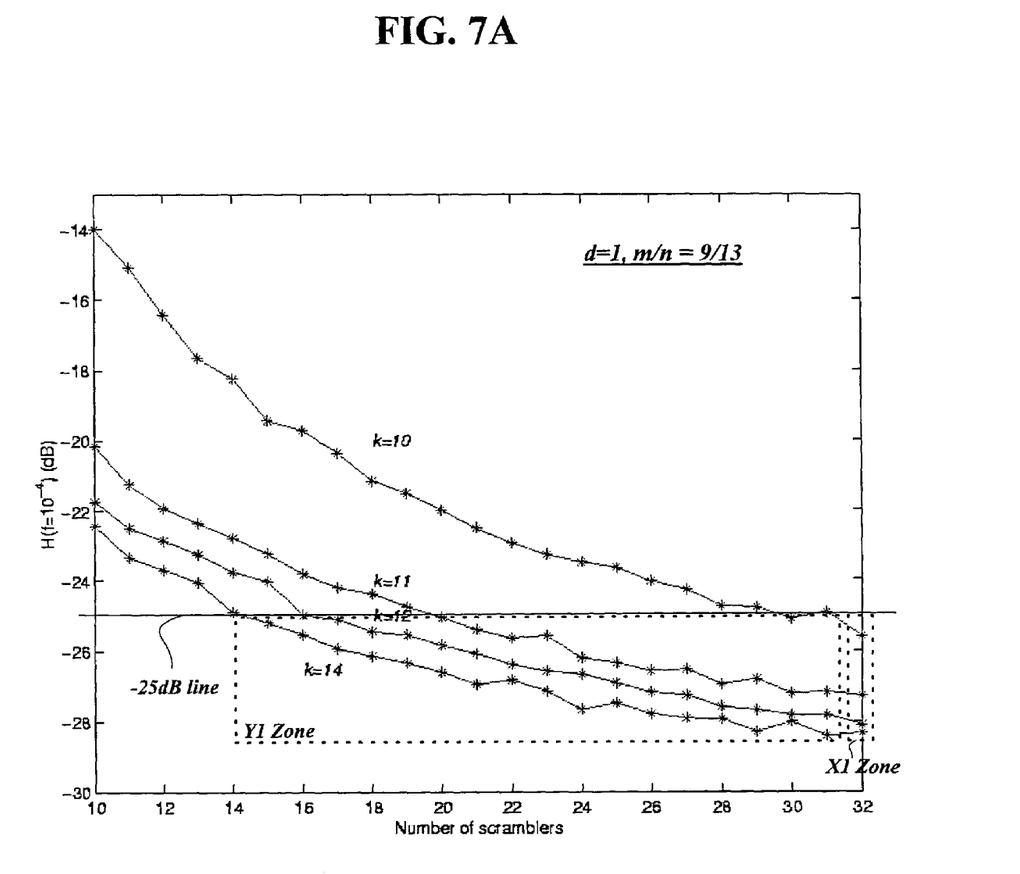
FIGS. 7A and 7B are experimental graphs showing low-frequency characteristics versus the number of scrambles to generate.

FIG. 7A shows an experimental result showing the low-frequency characteristics of signals modulated by the method proposed in PCT application No. PCT/KR00/01292 filed by same applicant as this. The experiments are conducted under the conditions of r=5, d=1, and the coding rate (m/n)=9/13.

In the graph of FIG. 7A, the lower the value 'H' is the better the low-frequency characteristics of a modulated signal is. To obtain better low-frequency characteristics than −25 dB, which is conventional criterion, it can be known that the constraint k should be chosen among 10 and above (refer to 'X1' block in FIG. 7A). Although the length r of a digital word is fixed to 5, the scrambles may be generated fewer than the maximum number 32 (=$2^5$). The x-coordinate of FIG. 7A uses the number of scrambles as an independent variable to show low-frequency characteristics of a modulated signal where both of the generator 20 and the selector 22 are composed of fewer registers than the possible number by 5 bits.

If better than −25 dB should be met for the low-frequency characteristics, from the 'Y1' block of the graph of FIG. 7A, it can be known that the number of scrambles is reduced up to about 15 from 32 under the condition of k=14, up to about 17 under k=12, and up to about 21 under k=11.

There are two methods using fewer scrambles. The first method selects as many digital words as necessary among whole $2^r$ digital words, and then generates as many intermediate sequences 41 as the number of the selected digital words by combining the selected digital words with an input data word. The second method generates $2^r$ intermediate sequences 41 and then scrambles as many intermediate sequences as necessary to form fewer alternative sequences 21.

The fact that the number of scrambles can be reduced under the given low-frequency characteristics means that hardware can be less complicated because of register reduction in the parallel processing structure, and that processing speed can become higher in the serial processing structure.

Figure 7B:
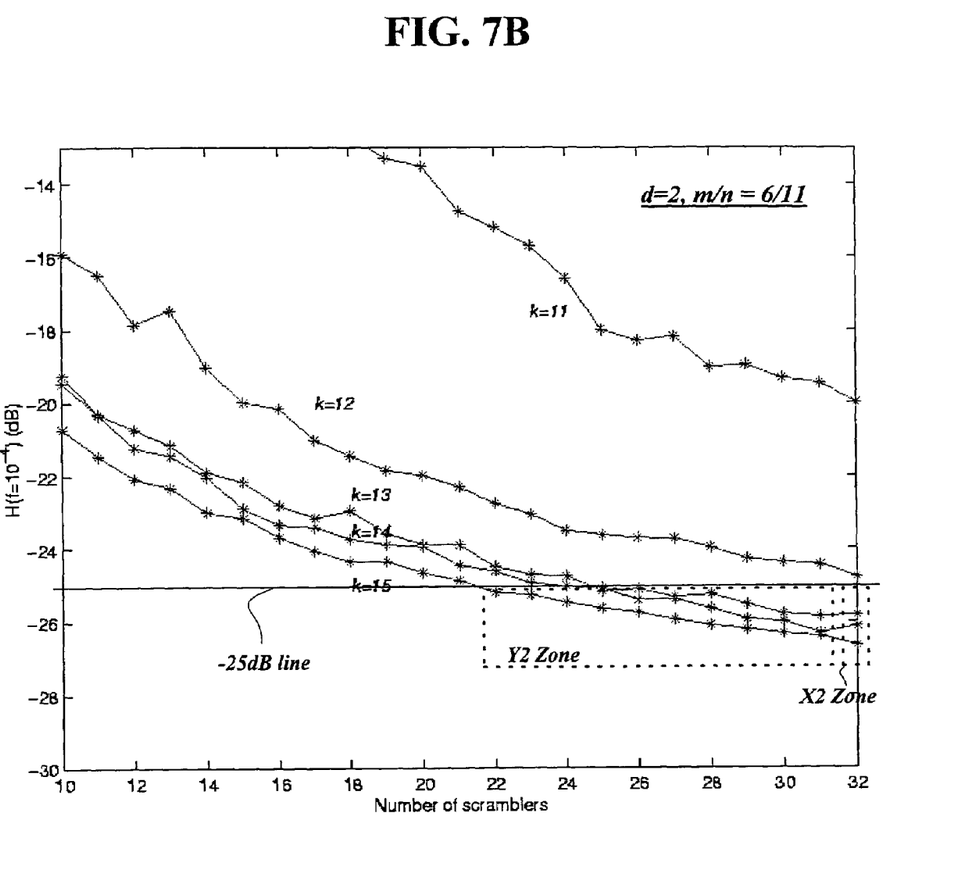

FIG. 7B shows another experimental result for low-frequency characteristics of signals modulated by the method proposed in the PCT application No. PCT/KR01/00359 filed by same applicant as this. The experiments are conducted under the conditions of r=5, d=2, and the coding rate (m/n)= 6/11.

To obtain better than −25 dB low-frequency characteristics in this experimental result, it can be known that the constraint k should be chosen among 13 and above (refer to 'X2' block in FIG. 7B). If better characteristics than −25 dB should be met for the low-frequency characteristics, from the 'Y2' block of the graph of FIG. 7B, it is apparent that the number of scrambles can be reduced up to about 22 from 32 under the condition of k=15, up to about 25 under k=14, and up to about 27 under k=13.

From the experiments of FIGS. 7A and 7B, it can be known that if an input data word of A-bit is divided into $A_1$-, $A_2$-, $A_3$-, . . . , $A_n$-bit data words and the digital word of bit length $r_i$ satisfying $A_i+r_i=c_i m$ for each $A_i$ is used to generate intermediate sequences wherein $r_i$ is smaller than the bit length r satisfying A+r=cm for A-bit data word, it is also possible to obtain better low-frequency characteristics than −25 dB which could be attainable by the bit length r appropriate for A-bit data word.

Usage of bit length $r_i$ smaller than r can reduce the complexity of necessary hardware remarkably.

Recorded data after modulated according to the above-explained method are restored by a demodulator conducting the above-explained method in reserve order, that is, decoding, de-scrambling, and eliminating r-bit digital word, sequentially.

Figure 8:
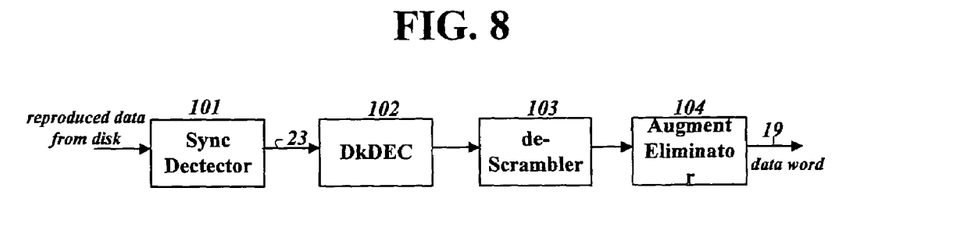
FIG. 8 shows a block diagram of a demodulator for demodulating (d,k) constrained sequences having been recorded according to the present invention.

FIG. 8 is a block diagram of a demodulator conducting such operations. A sync detector 101 detects a sync code contained in a sequence, whose frame size is D*($A_i+r_i$)*m/n+sync bit length where D is the number of dividing times for an input data word, reproduced from an optical record carrier, and removes the detected sync code. Then, the sync-removed sequence consists of D sequences 23, whose frame size is ($A_i+r_i$)*m/n, satisfying the (d,k) constraint. The D (d,k) constrained sequences 23 are applied sequentially to a decoder 102 which decodes each n-bit word in the sequence into corresponding m-bit word, thus, frame size of the decoded sequence becomes $A_i+r_i$. A de-scrambler 103 restores the decoded sequence into an intermediate sequence 41 which is one before scrambled. Then, an augment eliminator 104 removes $r_i$-bit digital word contained in the front, middle, or rear of the original sequence, and outputs an original divided data word 19 whose frame size is $A_i$. If such-outputted data words are gathered D times, then they forms one original non-divided data word of A-bit.

The method and apparatus of converting a series of data words into a modulated signal according to the present invention, makes it possible to manufacture much simpler hardware for a coding system suppressing dc-components of sequences, and excluding a sync pattern, long string of '0's, and long runs of the smallest runlength d from a recording sequence, under the rules of the (d,k) code.

The invention may be embodied in other specific forms without departing from the sprit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of converting a series of data word into a modulated signal with coding rate of m/n, comprising the steps of:
   (a) using a generator, generating for each data word a number of intermediate sequences by combining mutually different digital words with the data word;
   (b) scrambling each intermediate sequence to form a set of alternative sequences;
   (c) translating each alternative sequence into a (d,k) constrained sequence according to the coding rate m/n;
   (d) measuring how much undesirable each (d,k) constrained sequence is, based on at least one of a "0" runlength (consecutive "0"s), an occurrence of a prescribed sync pattern and an alternate Tmin (minimum inversion period) runlength; and
   (e) selecting one (d,k) constrained sequence for recording onto a recordable medium among the translated (d,k) constrained sequences based on the measuring.

2. The method of claim 1, wherein a length r of the digital word has been determined such that bit length of the data word added by the length r is a multiple of m.

3. The method of claim 1, wherein in the step (a), $2^r$ intermediate sequences are generated for each word by combining all possible digital words of length r with the data word.

4. The method of claim 1, wherein the intermediate sequences are generated by placing the digital words in front, middle, or rear of the data word.

5. The method of claim 1, wherein the step (c) is performed with parameters of m=9, n=13, d=1, or m=11, n=16, d=1, or m=13, n=19, d=1.

6. The method of claim 1, wherein the step (c) is performed with parameters of m=6, n=11, d=2 or m=11, n=20, d=2, or m=7, n=13, d=2.

7. The method of claim 1, wherein the step of measuring further includes measuring how much undesirable each (d,k) constrained sequence is, based on a low-frequency content.

8. The method of claim 7, further comprising the step of translating the (d,k) constrained sequence into a runlength-limited sequence with suppressed low-frequency components.

9. The method of claim 7, wherein the step (e) includes:
   measuring the "0" run length within an alternative (d,k) constrained sequence and giving a higher penalty as being undesirable for a longer "0" run length;
   detecting if the prescribed sync pattern occur in the alternative (d,k) constrained sequence and if so, flagging as undesirable the alternative (d,k) constrained sequence;
   measuring a number of consecutive Tmin runlength in order to flag as undesirable a sequence having much repetitive Tmins that violate Maximum Transition Run constraint; and
   measuring a DSV (Digital Sum Value) of the alternative (d,k) constrained sequence in order to measure the low-frequency component after the alternative (d,k) constrained sequence is modulated using a precoding device, wherein the low-frequency component is undesirable.

10. An apparatus of converting a series of data word into a modulated signal with coding rate of m/n where m<n, comprising:
    a generator including:
       an augmentor that generates for each data word a number of intermediate sequences by combining mutually different digital words with the data word, and
       a scrambler that scrambles each intermediate sequence to form a set of alternative sequences; and
    a selector including:
       a (d,k) encoder that translates each alternative sequence into a (d,k) constrained sequence according to the coding rate m/n,
       a judging unit that measures how much undesirable each (d,k) constrained sequence is, based on at least one of a "0" runlength (consecutive "0"s), an occurrence of a prescribed sync pattern and an alternate Tmin (minimum inversion period), and
       a selecting unit that selects one (d,k) constrained sequence for recording onto a recordable medium among the translated (d,k) constrained sequences based on a measuring of the judging unit.

11. The apparatus of claim 10, wherein a length r of the digital word has been determined such that bit length of the data word added by the length r is a multiple of m.

12. The apparatus of claim 10, wherein the augmentor is embodied so as to generate for each data word $2^r$ intermediate sequences by combining all possible digital words of length r with the data word.

13. The apparatus of claim 10, wherein the intermediate sequences are generated by placing the digital words in front, middle, or rear of the data word.

14. The apparatus of claim 10, wherein the (d,k) encoder has parameters of m=9, n=13, d=1, or m=11, n=16, d=1, or m=13, n=19, d=1.

15. The apparatus of claim 10, wherein the (d,k) encoder has parameters m=6, n=11, d=2 or m=11, n=20, d=2, or m=7, n=13, d=2.

16. The apparatus of claim 10, wherein the judging unit further measures how much undesirable each (d,k) constrained sequence is, based on a low-frequency content.

17. The apparatus of claim 16, further comprising a precoder that translates the (d,k) constrained sequence into a runlength-limited sequence with suppressed low-frequency components.

18. The apparatus of claim 16, wherein the judging unit includes:
    a "0" runlength metric calculator for measuring the "0" run length within an alternative (d,k) constrained sequence and giving a higher penalty as being undesirable for a longer "0" run length;
    a sync detector for detecting if the prescribed sync pattern occur in the alternative (d,k) constrained sequence and if so, flagging as undesirable the alternative (d,k) constrained sequence;
    a Tmin metric calculator for measuring a number of consecutive Tmin runlength in order to flag as undesirable a sequence having much repetitive Tmins that violate Maximum Transition Run constraint; and a DSV metric calculator for measuring a DSV (Digital Sum Value) of the alternative (d,k) constrained sequence in order to measure the low-frequency component after the alternative (d,k) constrained sequence is modulated using a precoding device, wherein the low-frequency component is undesirable.

* * * * *